United States Patent [19]

Blake

[11] Patent Number: 5,696,858
[45] Date of Patent: Dec. 9, 1997

[54] FIBER OPTICS APPARATUS AND METHOD FOR ACCURATE CURRENT SENSING

[75] Inventor: James N. Blake, College Station, Tex.

[73] Assignee: The Texas A&M University System, College Station, Tex.

[21] Appl. No.: 691,748

[22] Filed: Aug. 1, 1996

[51] Int. Cl.$^6$ .................................................. G02B 6/26
[52] U.S. Cl. .................... 385/12; 250/227.18; 324/97; 324/224.1
[58] Field of Search .................. 250/22.17, 227.18; 356/364, 365; 324/96, 200, 207.13, 207.14, 207.22, 224.1, 260, 95, 97; 385/12

[56] References Cited

U.S. PATENT DOCUMENTS

| | | | |
|---|---|---|---|
| 4,545,682 | 10/1985 | Greenwood | 356/350 |
| 4,578,639 | 3/1986 | Miller | 324/96 |
| 4,613,811 | 9/1986 | Vaerewyck et al. | 324/96 |
| 4,615,582 | 10/1986 | Lefevre et al. | 350/96.29 |
| 4,733,938 | 3/1988 | Lefevre et al. | 350/96.29 |
| 4,894,608 | 1/1990 | Ulmer, Jr. | 324/96 |
| 4,947,107 | 8/1990 | Doerfler et al. | 324/96 |
| 4,973,899 | 11/1990 | Jones et al. | 324/96 |
| 5,034,679 | 7/1991 | Henderson et al. | 324/96 |
| 5,051,577 | 9/1991 | Lutz et al. | 250/227.17 |
| 5,056,885 | 10/1991 | Chinn | 350/96.13 |
| 5,063,290 | 11/1991 | Kersey | 250/227.17 |
| 5,157,461 | 10/1992 | Page | 356/350 |
| 5,181,078 | 1/1993 | Lefevre et al. | 356/350 |
| 5,270,791 | 12/1993 | Lefevre et al. | 356/350 |
| 5,297,436 | 3/1994 | Chan et al. | 73/657 |
| 5,434,501 | 7/1995 | Esman et al. | 250/227.17 |
| 5,479,094 | 12/1995 | Esman et al. | 324/96 |
| 5,598,489 | 1/1997 | Pavlath et al. | 385/12 |

OTHER PUBLICATIONS

H. Taylor, "Fiber Sensors: 2", U.S. Naval Research Laboratory, Apr. 29, 1981, pp. 128–130.

R.T. de Carvalho, J. Blake, and G. Sanders, "Sagnac Interferometers for Accurate Measurements of True Nonreciprocal Effects", SPIE, vol. 2070, pp. 264–269 Sep. 1993.

Kent B. Rochford, Gordon W. Day, and Peter R. Forman, "Polarization Dependence of Response Functions in 3×3 Sagnac Optical Fiber Current Sensors", *Journal of Lightwave Technology*, vol. 12 No. 8, Aug. 1994, pp. 1504–1509.

P.A. Nicati and Ph. Robert, "Stabilised Current Sensor Using Sagnac Interferometer", *IOP Publishing Ltd.*, 1988, pp. 791–796.

P. Akhavan Leilabady, A.P. Wayte, M. Berwick, J.D.C. Jones, and D.A. Jackson, "A Pseudo–Reciprocal Fibre–Optic Faraday Rotation Sensor: Current Measurement and Data Communication Applications", *Elsevier Science Publishers*B.V., pp. 173–176 vol. 59, No. 3, Sep. 1986.

R.A. Bergh, H.C. Lefevre, and H.J. Shaw, "Geometrical Fiber Configuration for Isolators and Magnetometers", *Fiber–Optic Rotation Sensors and Related Technologies, Springer Series in Optical Sciences*32, 1982, pp. 111–116.

Guido Frosio and Rene Dandliker, "Reciprocal Reflection Interferometer for a Fiber–Optic Faraday Current Sensor", *Applied Optics*, vol. 33, No. 25, 1 Sep. 1994, pp. 6111–6122.

R.T. de Carvalho and J. Blake, "Simultaneous Measurement of Electric and Magnetic Fields Using a Sagnac Interferometer", Texas A&M University, College Station, Texas pp. 2–4, Sep. 1994.

*Primary Examiner*—John Ngo
*Attorney, Agent, or Firm*—Baker & Botts, L.L.P.

[57] ABSTRACT

A fiber optics sensor (10) and method for attaining accurate measurement are provided. A polarization maintaining optic fiber (22) forms a linear optical path. An optical element (24) is used to convert linearly polarized light waves to circularly polarized light waves which propagate along the optical path and pass through a sensing medium (24). Because of external stresses and disturbances, the optical element (24) introduces light of the wrong state of polarization into the optical path. The result is a scale factor error in the measurement and an extra incoherent D.C. light detected at the detector (36). The presence and magnitude of the extra incoherent D.C. light is used to provide a normalizing factor to compensate for the scale factor error.

24 Claims, 2 Drawing Sheets

FIBER OPTICS APPARATUS AND METHOD FOR ACCURATE CURRENT SENSING

TECHNICAL FIELD OF THE INVENTION

This invention relates in general to the field of fiber optic sensors. More particularly, the present invention relates to fiber optics apparatus and method for accurate current sensing.

RELATED PATENT APPLICATION

This patent application is related to U.S. patent application titled "Fiber Optic Interferometric Current and Magnetic Field Sensor," Ser. No. 08/620,121, and filed on Mar. 26, 1996 by James N. Blake, which is a continuation of application Ser. No. 08/320,734, filed Oct. 7, 1994 of the same title and inventor, now abandoned.

BACKGROUND OF THE INVENTION

Over the past decade, fiber optic sensors have received attention in the application of magnetic field sensing and current sensing. Fiber optic current sensors are particularly advantageous over iron-core current transformers, since fiber optic sensors are non-conductive and light weight. Furthermore, fiber optic sensors also do not exhibit hysteresis and provide a much larger dynamic range and frequency response.

Fiber optic current sensors work on the principle of the Faraday effect. Current flowing in a wire induces a magnetic field which, through the Faraday effect, rotates the plane of polarization of the light traveling in the optical fiber wound around the current carrying wire. Faraday's law, stated as:

$$I = \oint H.dL$$

where I is the electrical current, H is the magnetic field and the integral is taken over a closed path around the current. If the sensing fiber is wound around the current carrying wire with an integral number of turns, and each point in the sensing fiber has a constant sensitivity to the magnetic field, then the rotation of the plane of polarization of the light in the fiber depends on the current being carried in the wire and is insensitive to all externally generated magnetic fields such as those caused by currents carried in nearby wires. The angle, $\Delta\phi$, through which the plane of polarization of light rotates in the presence of a magnetic field is given by:

$$\Delta\phi = V \oint H.dL$$

where V is the Verdet constant of the fiber glass. The sensing optical fiber performs the line integral of the magnetic field along its path which is proportional to the current in the wire when that path closes on itself. Thus, $\Delta\phi = VNI$, where N is the number of turns of sensing fiber wound around the current carrying wire. The rotation of the state of polarization of the light due to the presence of an electrical current is measured by injecting light with a well defined linear polarization state into the sensing region, and then analyzing the polarization state of the light after it exits the sensing region.

In related U.S. patent application entitled "Fiber Optic Interferometric Current and Magnetic Field Sensor," Ser. No. 08/620,121, filed on Mar. 26, 1996 by James N. Blake (Hereinafter "Blake"), in-line or linear fiber optic sensors for measuring current and magnetic fields are taught. Blake is incorporated herein by reference. Blake teaches splitting the light beam into light traveling on the first and second principle eigen axes, the use of a birefringence modulator to apply a waveform or waveforms to birefringent modulate the light beam, and further the use of a quarter waveplate set at 45° to the principle axes of the fiber to convert orthogonally linearly polarized light to counter-rotating circularly polarized light prior to entering the sensing region. Upon reflection at the end of the fiber, the sense of rotation of the two light waves are reversed and the light waves travel back through the sensing region, are converted back to linearly polarized light, and are propagated back to a photodetector. The two light waves therefore undergo reciprocal paths and the same polarization evolution through the optical circuit. The fiber optic sensors taught by Blake overcame many disadvantages associated with conventional all fiber sensors. However, the sensor and sensing method still suffers from a particularly exacerbating problem which affects the accuracy of the sensor. To have a very accurate measurement, the optical components, particularly the quarter waveplate, must be perfect and not be affected by external stresses such as temperature variations and mechanical disturbances. It is well recognized that perfect or nearly perfect quarter waveplate are difficult and very costly to manufacture to achieve accurate sensing required by certain applications.

SUMMARY OF THE INVENTION

Accordingly, a need has arisen for apparatus and method for compensating the error introduced by the optical element that converts linearly polarized light waves to circularly polarized light waves and back such as an imperfect quarter waveplate.

In accordance with the present invention, a fiber optics sensor and method for accurate measurements are provided which eliminates or substantially reduces the disadvantages associated with prior optical sensors.

In one aspect of the invention, the fiber optics sensor comprises a polarization maintaining optic fiber forming an optical path, two linearly polarized light waves traveling in the polarization maintaining optic fiber on the optical path, and at least one optical element such as a quarter waveplate coupled to the optic fiber for converting the two linearly polarized light waves into two circularly polarized light waves traveling on the optical path toward a sensing region. The sensing region includes a sensing medium coupled to the polarization maintaining optic fiber at generally a midpoint in the optical path, the circularly polarized light waves passing through the sensing medium experiencing a differential phase shift caused by a magnetic field or current flowing in a conductor proximate to the sensing region. Further, a detector is coupled to the optic fiber for detecting the differential phase shift in the circularly polarized light waves producing an output correlative to a magnitude of the magnetic field or the current, where the detector output including an incoherent D.C. light component introduced by an imperfection in the quarter waveplate. There is included means for receiving detector output and correcting the detected magnitude in response to the incoherent D.C. light component to provide an accurate sensor measurement. Various ways of determining a normalizing factor to correct the measurement output are provided. In another embodiment, the wavelength of the light source may be varied in response to the magnitude of the detected incoherent D.C. light.

In another aspect of the invention, a method for accurately measuring current flowing in a conductor using an in-line fiber optics sensor is provided. The method comprises the steps of providing a polarization maintaining optic fiber forming an optical path, and generating and sending two linearly polarized light waves traveling in the polarization maintaining optic fiber on the optical path. The two linearly polarized light waves are then converted into two circularly polarized light waves which travel through the sensing region and experience a differential phase shift caused by the current flowing in the conductor proximate to the sensing region. The circularly polarized light waves return through the sensing region again and are then converted back to the linear polarization. The differential phase shift in the circularly polarized light waves are detected to produce an output correlative to a magnitude of the current. The detector output includes an incoherent D.C. light component introduced by an imperfection in the converting step. The detector output is received and corrected in response to the incoherent D.C. light component to provide an accurate sensor measurement.

A technical advantage of the teachings of the present invention is providing an economical way to compensate for errors introduced in the optical circuit by an imperfect optical element, such as the quarter waveplate. As a result, accurate measurement can be achieved without costly or impractical circuitry or signal analysis and processing.

BRIEF DESCRIPTION OF THE DRAWINGS

For a better understanding of the present invention, reference may be made to the accompanying drawings, in which.

DETAILED DESCRIPTION OF THE INVENTION

The preferred embodiment of the present invention and its advantages are best understood by referring to FIGS. 1-6 of the drawings, like numerals being used for like and corresponding parts of the various drawings.

Figure 1:
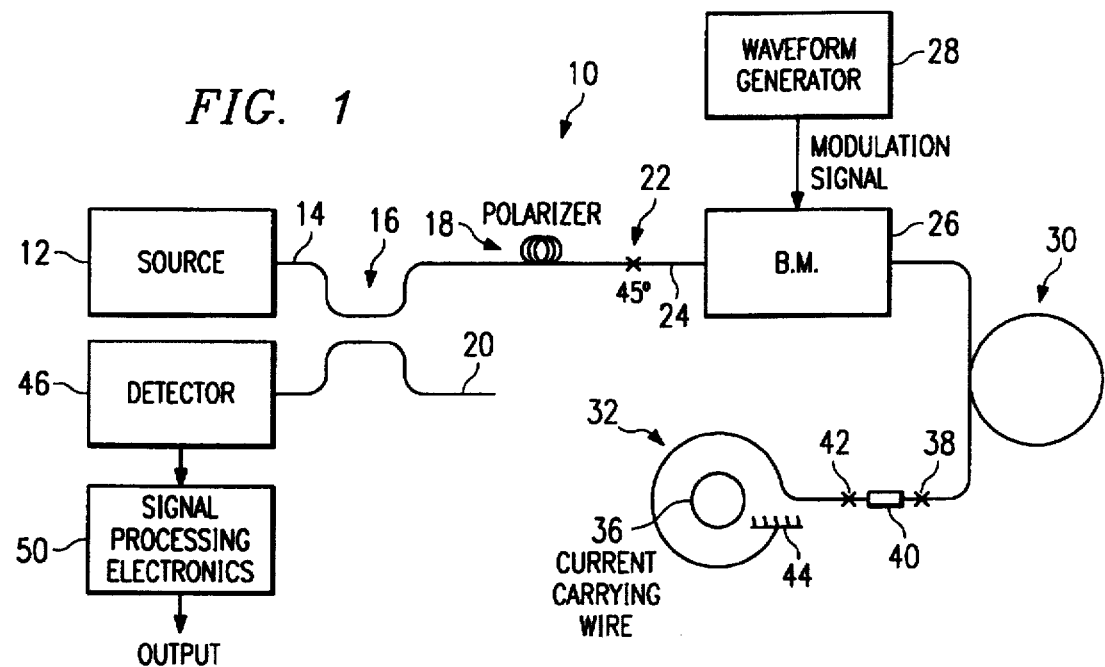
FIG. 1 is a schematic diagram of an embodiment of an in-line fiber optic sensor.

In FIG. 1, a current sensor 10 constructed according to the teachings of the present invention comprises a broadband light source 12, which introduces a broadband light having multiple optical frequency components into a optic fiber pigtail 14. Optic fiber pigtail 14 is preferably a length of polarization maintaining fiber. Polarization maintaining fiber pigtail 14, is joined to a polarization maintaining beam splitter or directional coupler 16 where a portion of the light is directed to a polarizer 18 and the remaining light is terminated at a non-reflective termination point 20. The light beam passes through polarizer 18, which linearly polarizes the light. The eigen-axes of polarization maintaining fiber pigtail 14, polarization maintaining beam splitter 16, and polarizer 18 are aligned to one another and to the principle axis of light source 12, so as to ensure maximum light input into the sensing region. Polarization cross coupling points caused by any misalignment of these axes, in combination with an imperfect polarizer, may result in the presence of small offsets in the current measurement and should be avoided as much as possible.

After the light passes through polarizer 18, it is divided substantially equally into X and Y light waves by a 45° splice 22 into the two eigen-axes, X and Y respectively, of a birefringence modulator pigtail 24. Birefringence modulator pigtail 24 is a section of polarization maintaining fiber of sufficient length to depolarize the light passing through it. Birefringence modulator pigtail 24 is connected to a birefringence modulator 26, the X and Y eigen axes of these two components being aligned. Birefringence modulator 26 may be an integrated optics waveguide formed on Ti-indiffused $LiNbO_3$ with metallic electrodes surrounding the waveguide. Alternatively, a piezo-electric modulator may also be used. A voltage applied across the electrodes alters the birefringence of the waveguide. A modulation signal generated by a waveform generator 28 is applied to the electrodes of birefringence modulator 26 to dither or phase modulate the light beams. The modulation signal may be a variety of forms including, for example, sine wave modulation, square wave modulation, triangle wave modulation, serrodyne modulation, sawtooth modulation, and other suitable periodic waveforms. The modulation signal may also be a combination of a ramp function and a periodic waveform.

After the light is modulated in birefringence modulator 26, it enters a predetermined length of polarization maintaining fiber bus 30. The principle axes of polarization maintaining fiber bus 30 are aligned to the principle axes of the birefringence modulator 26. Polarization maintaining fiber bus 30 serves two purposes. The first is to carry the light to a passive sensing medium or sensing fiber 32, which typically is remotely located from the active elements such as light source 12 and birefringence modulator 26. The second purpose of polarization maintaining fiber bus 30 is to provide a time delay of sufficient length that the modulation signal applied at birefringence modulator 26 substantially changes its value during the time it takes for the light to propagate from birefringence modulator 26 to sensing fiber 32 and return. Ideally, the fundamental dither frequency of the waveform applied to birefringence modulator 26 is $1/2\tau$ or odd multiples thereof, where $\tau$ is the propagation time for the light waves to travel from birefringence modulator 26 through sensing medium 32 and back.

After passing through polarization maintaining fiber bus 30, the light goes through a 45° splice 38, a zero or multiple order quarter wave plate 40 set at 45° to the principle axes of the polarization maintaining fiber bus 30, and a single mode fiber splice 42. The purpose of quarter wave plate 40 is to convert the orthogonally linearly polarized light from each of the principle axes of polarization maintaining fiber bus 30 to circular states of polarization. The quarter wave plate 40 is preferably constructed from a short section of long beat length polarization maintaining fiber, ideally a quarter of a polarization beat length long. An odd multiple of quarter beat lengths of length is also acceptable.

Therefore, two opposingly circularly polarized light waves are generated by quarter waveplate 40. The X light wave from the first principle axis or X axis of polarization maintaining fiber bus 30 is converted to a right hand circularly polarized (RHCP) light wave. The Y light wave from the second principle axis or Y axis of polarization maintaining fiber bus 30 is converted to a left hand circularly polarized (LHCP) light wave. The two circularly polarized light waves then pass through sensing fiber 32 wrapped around a current-carrying wire 36 at different velocities, accumulating a phase difference in proportion to the magnetic field component aligned with sensing fiber 32. Sensing fiber 32 may be constructed from a single mode fiber having a low birefringence per unit length and wound an integral number of turns around current carrying wire 36. For most applications, one to five loops of sensing fiber 32 around wire 36 has been shown to be sufficient. It is known that birefringence in sensing fiber 32 changes the sensitivity of sensor 10 as well as making it sensitive to magnetic fields arising from external sources. The use of a short length of sensing fiber 32 is thus advantageous for minimizing the total birefringence.

A reflector 44, such as a mirror or mirrored surface, terminates sensing fiber 32. The light is reflected by mirror 44 and passes through sensing fiber 32 again. The sense of circular polarization of the light is reversed upon reflection, causing the right hand circularly polarized light wave to be converted to be left hand circularly polarized for its return trip through sensing fiber 32, and vice versa for the left hand circularly polarized light. Since the sense of polarization and the direction of the light are reversed for both light waves during their return trip through sensing fiber 32, the relative differential phase shift accumulated between them during the first pass through sensing fiber 32 is doubled during the return trip. The total phase shift, $\Delta\phi$, accumulated between the two light waves in the double pass sensing region 60 is thus $\Delta\phi=4$ VNI, where V is the Verdet constant of the fiber glass, N is the number of turns of sensing fiber around current carry wire 36 and I is the current flowing in wire 36.

After the light makes its double pass through sensing fiber 32, the light wave that was originally in the first principle axis of polarization maintaining fiber bus 30 returns to bus 30 linearly polarized along its second principle axis, and the light wave that was originally in the second principle axis of polarization maintaining fiber bus 30 returns to bus 30 linearly polarized along its first principle axis. The light waves then pass through birefringence modulator 26 and its pigtail 24 a second time, and are brought together and interfered by 45° splice 22 and polarizer 18. A portion of this light is then coupled to a photodetector 46 via polarization maintaining beam splitter 16. A signal processing electronics circuit 50 coupled to photodetector 46 may be used to provide a measurement output.

Therefore, the two light waves underwent exactly the same polarization evolution throughout the optical circuit, only in reverse order. Because sensing medium 32 is in-line with respect to the optic fiber, it may be seen that the sensing region around wire 36 is positioned at the midpoint of the optical path traversed by both light waves. Therefore, the only phase difference between the two light waves is that generated by the presence of a magnetic field in the sensing region.

However, when the quarter waveplate is not perfectly constructed or operating perfectly, some light traverses the sensing region in the wrong state of circular polarization, thereby causing inaccurate measurement. In addition, an extra D.C. light is a byproduct of the imperfect quarter waveplate. The operation of the quarter waveplate is affected by its operating environment, such as temperature variations and other external stresses. In particular, the beat length, $L_B$, varies with ambient temperature, which is typically 0.1% per °C. Because the quarter waveplate is typically located remotely from the light source and other electronics, and is typically exposed to the external elements, it encounters large temperature variations. With a temperature differential that can reach, for example, 100° between the high temperatures in the Summer and the low temperatures in the Winter, the beat length can change by 10% or more.

Figure 2A:
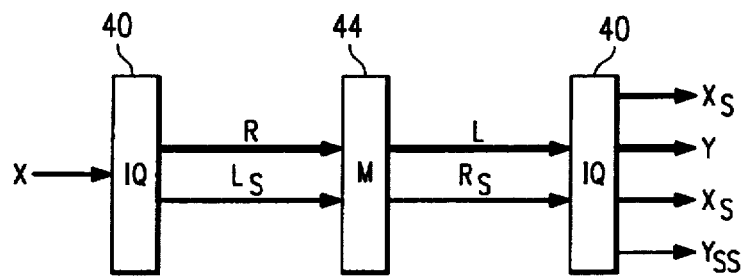
FIGS. 2A and 2B are schematic diagrams of the paths taken by the X and Y light waves along the principle and secondary axes of the fiber to illustrate the problem.
Figure 2B:
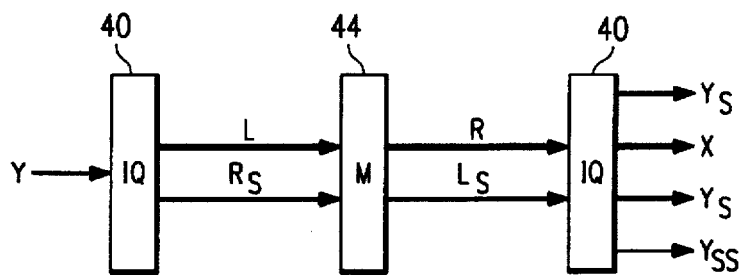

Referring to FIGS. 2A and 2B, the paths of the two light waves are shown explicitly with the approximate relative strengths of the light components indicated as shown. Imperfect quarter waveplate (IQ) 40 converts the X light wave on the first principle axis of the fiber bus to right hand circularly polarized (R) light wave and a small left hand circularly polarized ($L_S$) light component due to the imperfection of quarter waveplate 40. Mirror 44 reflects the light waves and changes them to left hand circularly polarized light (L) and a small right hand circularly polarized light ($R_S$). The second pass through imperfect quarter waveplate 40 converts the left hand circularly polarized light (L) to a Y light wave on the second principle axis of the fiber bus and a small X light wave ($X_S$) on the first principle axis. The small right hand circularly polarized light $R_S$ is converted to a small X light wave ($X_S$) and an even smaller Y light wave ($Y_{SS}$). The two $X_S$ light components are incoherent with all other light components at the detector and thus do not provide an interference signal. The two $X_S$ light components comprise one-half of the extra D.C. light detected at the photodetector. The $Y_{SS}$ light component results in a scale factor error, where the scale factor is equal to the photodetector output divided by the current in the wire. The affected scale factor contributes to the computation of inaccurate value for the current. Note that the subscript S is used to denote the intensities of the light waves as compared with the main light wave, which in this case is Y, but is not intended to indicate that the small light wave components have the same intensity.

As shown in FIG. 2B, the Y light wave traveling on the second principle axis is similarly converted by imperfect quarter waveplate 40 into two components: left hand circularly polarized light (L) and a small right hand circularly polarized light ($R_S$). Mirror 44 reflects the light waves and reverses the sense of polarization of the light waves into right hand circularly polarized light (R) and a small left hand circularly polarized light ($L_S$). When these two light waves pass through imperfect quarter waveplate 40 the second time, the right hand circularly polarized light is converted to a main X light wave and a small Y light wave ($Y_S$), and the small left hand circularly polarized light ($L_S$) is converted to a small Y light wave ($Y_S$), and an even smaller X light wave ($X_{SS}$). The two $Y_S$ light waves traveling on the second principle axis of the fiber bus comprise the other half of the extra incoherent D.C. light detected by the photodetector. The $X_{SS}$ light component gives rise to an error in the scale factor and resulting in inaccurate current measurement by the sensor.

In both light waves, the resultant extra D.C. light provides a clue to the magnitude of the $X_{SS}$ and $Y_{SS}$ and thus the scale factor error. Knowing the D.C. and A.C. components and ratio or relative proportion of the modulation signals, the relative proportion of the D.C. and A.C. components of the detected light at the detector can be compared therewith to determine the magnitude of extra D.C. light or error that is introduced by the quarter waveplate.

There are two basic methods to compensate for the error caused by the imperfect quarter waveplate and achieve a very accurate current measurement with sensor 10. One method is to vary the wavelength of the broadband light from light source 12 (FIG. 1) to minimize or eliminate the extra D.C. light components detected by detector 46. There are several ways to vary the wavelength of the light output. For example, the wavelength of light source 12 is affected by changes in ambient temperature. Therefore, light source 12 may be coupled to a heat sink (not shown) and a temperature controller (not shown) that are used to change the ambient temperature surrounding light source 12. Typically, the wavelength of light source 12 changes by several hundred parts per million per degree centigrade. However, to compensate for a 100° C. temperature change experienced by the quarter waveplate, for example, the required temperature change for the light source may be greater than 100° C. Although achievable, this range of temperature variation may not be reasonable for most applications.

As another example of a method for varying the source wavelength is to selectively filter very broad spectrum light. The filter is used to vary the range of wavelengths of the resulting broadband light output to compensate for the errors caused by quarter waveplate thermal variations. However, this method requires the construction of the wavelength filter, which may be costly.

The method by which the imperfect quarter waveplate is compensated by changing the wavelength of the incoming light is contemplated herein as described above. However, it may be seen that this method is practicable only when the temperature variation experienced by the quarter waveplate is relatively small.

The second method for generating accurate sensor operations is to measure the extra D.C. light and provide corrections therefor. The intensity of the light detected by photodetector 46 of FIG. 1 is related to the electric current flowing in the wire and to the modulation signal applied to the birefringence modulator 26 through the relation:

$$I_D = \frac{I_0}{2} \cdot \{1 + \cos[4VNI + \phi(t) - \phi(t-\tau)]\}$$

where $I_D$ is the total detected power, $I_0$ is the power falling on the photodetector 34 in the absence of electric current and birefringence modulation, $\phi(t)$ is the birefringence modulation waveform present in the birefringence modulator, and $\tau$ is the round trip delay time from the birefringence modulator 26 to the end of the sensor 10 and back. In addition to containing a periodic waveform component, $\phi(t)$ may also contain a ramp-like component, for example, so that the difference between $\phi(t)$ and $\phi(t-\tau)$ is a constant plus a periodic waveform. Therefore the modulation signal has a D.C. and an A.C. component. The slope of the ramp, and thus the value of the constant may be chosen to cancel the electric current induced phase, or 4 VNI. Thus, the value of the current being sensed may be determined from the slope of the ramp necessary to cause the cancellation to occur.

The above equation may also be written as:

$$I_D = \frac{I_0}{2} \cdot \{1 + \cos(4VNI + \phi_m \cos\omega t)\}$$

where $\phi_m$ is a short hand for the modulation signal which may be a sine wave, for example.

The apparatus and method for compensating for errors introduced by the imperfect quarter waveplate is to measure the error expressed as a single number, $\delta$, and correct the scale factor to arrive at the accurate measurement. $\delta$ is derived by defining a Jones matrix,$\overline{L}$, which describes the element that is intended to convert linearly polarized light to circularly polarized light. In the embodiment of the present invention, a quarter waveplate set at 45° to the birefringent axes of the polarization maintaining fiber bus is used for the conversion. In general, $\overline{L}$ can be expressed as:

$$\begin{bmatrix} p+jq & r+js \\ -r+js & p-jq \end{bmatrix}$$

where p, q, r, s are real numbers and $j=\sqrt{-1}$. This way of expressing $\overline{L}$ is a general result for optical elements having polarization independent loss. For an ideal quarter waveplate set at 45°, we obtain $p=\frac{1}{2}$, $q=-\frac{1}{2}$, $r=\frac{1}{2}$, and $s=-\frac{1}{2}$. Then, $\delta$ is defined as $2(ps+qr)+1$, where ideally, $\delta=0$ when the quarter waveplate is operating perfectly and not influenced by external stresses.

Analyzing the fiber optics sensor using the Jones Matrix, including $\overline{L}$ as a general element, the detected light can be expressed as:

$$I_D = \frac{I_0}{2} \left[ 1 + \frac{[2(ps+qr)+1]^2}{4} \cos(4VNI - \gamma - \phi_m\cos\omega t) - \right.$$

$$\frac{1-4(ps+qr)^2}{2} \cos(\gamma + \phi_m\cos\omega t) +$$

$$\frac{[2(ps+qr)-1]^2}{4} \cos(4VNI + \gamma + \phi_m\cos\omega t)$$

$$= \frac{I_0}{2} \left[ 1 + \frac{\delta^2}{4} \cos(4VNI - \gamma - \phi_m\cos\omega t) + \right.$$

$$\frac{-2\delta + \delta^2}{2} \cos(\gamma + \phi_m\cos\omega t) +$$

$$\left( 1 - \delta + \frac{\delta^2}{4} \right) \cos(4VNI + \gamma + \phi_m\cos\omega t)$$

Dropping $\delta^2$, making $\gamma=0$, and using K to represent a constant dependent on the intensity of the detected light, the detected light becomes:

$$I_D = K\{1-\delta \cos(\phi_m\cos\omega t)+(1-\delta) \cos(4VNI+\phi_m\cos\omega t)\}$$

which is the equation used to analyze the solutions to the inaccurate current measurement problem.

If the quarter waveplate error or $\delta$ is zero, then there is a fixed relationship between the D.C. component of the detected light and all the harmonic signals therein. When $\delta$ is not zero, the proportion between the D.C. and the harmonic signals are corrupted.

Figure 3:
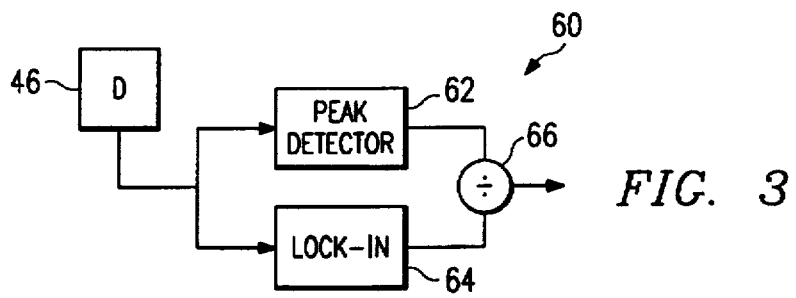
FIG. 3 is a schematic diagram of an exemplary signal processing circuit according to the teachings of the present invention.

Referring to an exemplary circuit 60 shown in FIG. 3, a peak detector 62 and a lock-in demodulator 64 are both coupled to photodetector 46 to receive an input representative of the light detected thereby. The output from photodetector 46 may be voltage level or current. Peak detector 62 determines the maximum level of the photodetector output, and lock-in demodulator demodulates the signal and provides the amplitude of the signal. The output of lock-in demodulator 64 and the output of peak detector 62 are coupled to a divider 66.

In operation, peak detector 62 provides the maximum level of the photodetector output, which may be expressed as:

$$I_{DMAX}=2K(1-\delta)$$

The output of lock-in demodulator essentially provides the first harmonic signal of the output, which may be expressed as:

$$I_{1H}=2KJ_1(\phi_m)4VNI(1-\delta)$$

where $J_1$ is the Bessel function. The output from lock-in demodulator 64 divided by the output from peak detector 62 yields:

$$\frac{I_{1H}}{I_{DMAX}} = J_1(\phi_m) 4 VNI$$

This equation is independent of δ and thus can be used to solve for the current, I, since all other parameters are known. It may be deduced from the foregoing that a microprocessor-based signal analysis system may also be used to accomplish the same or similar functions as the peak detector and lock-in modulator to derive the ratio and compare it with the expected ratio based on the modulation waveform inputs.

Figure 4:
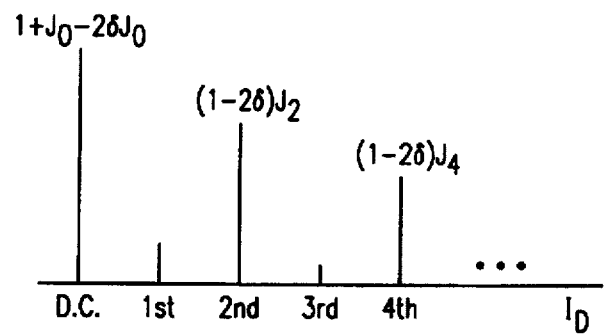
FIG. 4 is an exemplary plot of the D.C. and harmonic signals of the detected light output.

Referring to FIG. 4, a diagram of the D.C. component as well as some harmonic signals of the detected light is shown. It may be seen that the harmonic signals of the detected signal is on the order of (1−δ). Therefore, any one of the harmonic signals can be divided by any signal from the detected light that is also proportional to (1−δ). In the implementation described above, the numerator is the first harmonic signal and the denominator is the peak value of the detected light. However, it may be seen that any signal component that can be isolated out of the detected light can be used in a similar manner to derive the ratios.

Further, it may be seen from the foregoing that the teachings of the present invention provides for a comparison of the D.C. component of the detected light to the A.C. spectrum when no quarter waveplate errors are present, which is then used as the basis for comparison when errors are present. The apparatus and method described above provides for a comparison between the peak level, which is a combination of the D.C. signal and all the harmonics, and the first harmonic signal. However, the invention also contemplates other means of comparison to derive the relationship between the D.C. signals and the harmonic signals. For example, the second harmonic signal may be measured and divided by the measured D.C. signal to establish the basis for comparison for subsequent measurements that may include quarter waveplate error.

Referring again to the equation:

$$I_D = K\{1 + \cos[4VNI + \phi(t) - \phi(t-\tau)]\}$$

Using a ramp function in addition to a periodic waveform at the birefringence modulator, the detected light becomes:

$$I_D = K[1 + \cos(4VNI + \gamma + \phi_m \cos\omega t)]$$

where γ is a constant proportional to the slope of the ramp function. If γ=−4 VNI, then the detected light is:

$$I_D = K[1 + \cos(\phi_m \cos\omega t)]$$

Therefore, by setting γ=−4 VNI, the first harmonic signal of this output becomes zero. By changing the value of γ that is introduced into the system to zero out the first harmonic signal, the desired output is derived from the slope of the ramp function or saw tooth waveform.

Figure 5:
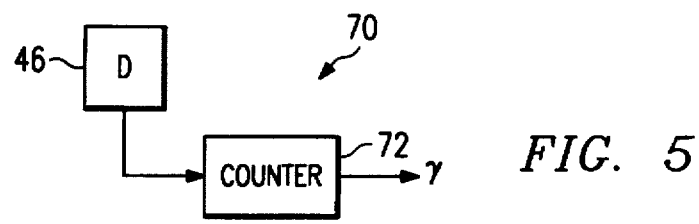
FIG. 5 is a block diagram of an exemplary signal processing circuit according to the teachings of the present invention.

Referring to FIG. 5 for a block diagram of an exemplary circuit implementation of the signal processing electronics, the slope of the ramp function or saw tooth waveform may be determined by using a counter 72 to count the number of saw tooths occurring during a specified time period. The higher the count corresponds to more steepness in the ramp slope. The counter output is thus proportional to γ.

Due to errors introduced by the quarter waveplate, γ≠−4 VNI but will actually be proportional to (1+δ):

$$\gamma = -4 VNI (1+\delta)$$

To cancel out δ, we may divide γ with a term that is proportional to (1+δ). Alternatively, γ may be multiplied with a term that is proportional to (1−δ) to generate a value proportional to (1−δ²), which is approximately 1 for small δ.

Using sine wave modulation on the birefringence modulator in addition to the saw tooth waveform so that:

$$\phi(t) - \phi(t-\tau) = \gamma + \phi_m \cos\omega t$$

and choosing $\phi_m = \Pi/2$:

$$\frac{I_{DMIN}}{I_{DMAX}} \approx \frac{(1+\delta)}{2}$$

Alternatively, with $\phi_m = 2.4$:

$$\frac{I_{DAVG}}{I_{DMAX}} \approx \frac{(1+\delta)}{2}$$

Thus, either of these methods may be used to obtain a suitable normalizing factor that removes the δ dependence inherent in γ.

Figure 6A:
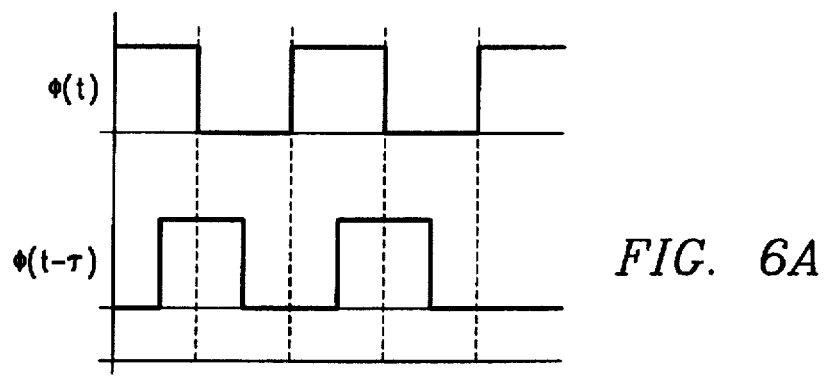
FIGS. 6A and 6B are plots of an exemplary modulation signals and the detected light output according to the teachings of the present invention.
Figure 6B:
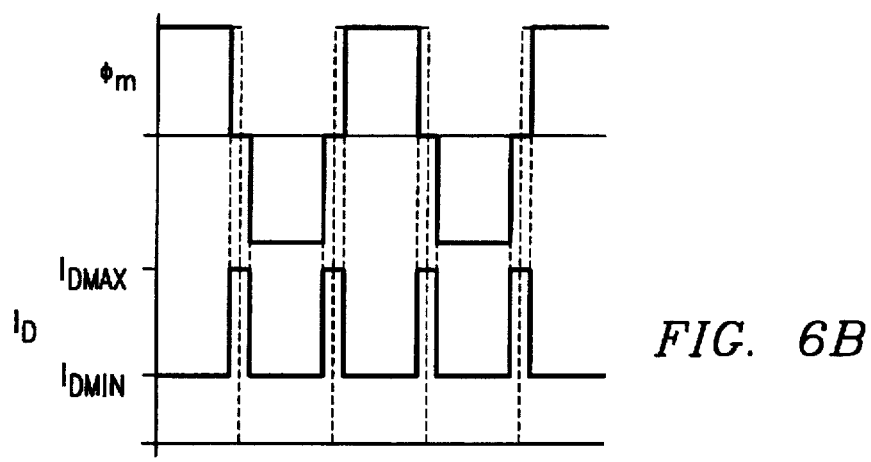

Referring to FIG. 6A, if square wave modulation is used on the birefringence modulator in addition to the ramp function or saw tooth waveform, then [φ(t)−φ(t−τ)] is equal to γ plus a more complicated periodic waveform. Choosing τ≠½ duty cycle for off-proper frequency operation, the resultant photodetector output is:

$$I_D = K[1 + \cos\phi_m(t)]$$

which is shown in FIG. 6B. Therefore, with a nonzero δ, and $\phi_m = \Pi/2$:

$$\frac{I_{DMIN}}{I_{DMAX}} = \frac{K}{2K(1-\delta)}$$

$$\approx \frac{1+\delta}{2}$$

which may be used as the normalizing factor to remove the dependence on δ that is inherent in γ.

Although the present invention and its advantages have been described in detail, it should be understood that various changes, substitutions and alterations can be made therein without departing from the spirit and scope of the invention as defined by the appended claims.

What is claimed is:

1. A fiber optics sensor, comprising:

a polarization maintaining optic fiber forming an optical path;

two linearly polarized light waves traveling in said polarization maintaining optic fiber on said optical path;

at least one quarter waveplate coupled to said optic fiber for converting said two linearly polarized light waves into two circularly polarized light waves traveling on said optical path toward a sensing region;

said sensing region including a sensing medium coupled to said polarization maintaining optic fiber at generally a mid-point in said optical path, said circularly polarized light waves passing through said sensing medium experiencing a differential phase shift caused by a magnetic field or current flowing in a conductor proximate to said sensing region;

a detector coupled to said optic fiber detecting said differential phase shift in said circularly polarized light waves producing an output correlative to a magnitude of said magnetic field or said current, said detector output including an incoherent D.C. light component introduced by imperfections in said quarter waveplate; and means for receiving said detector output and correcting said detected magnitude in response to said incoherent D.C. light component to provide an accurate sensor measurement.

2. The fiber optics sensor, as set forth in claim 1, wherein said correcting means comprises:

a D.C. level detector receiving said detector output for generating an output representative of the strength of a D.C. signal in said detector output;

an A.C. detector receiving said detector output for generating an output level correlative to an A.C. spectrum in said detector output; and a comparator receiving said D.C. output level and said A.C. output level and comparing the relative strengths thereof.

3. The fiber optics sensor, as set forth in claim 1, wherein said correcting means comprises:

a peak detector receiving said detector output for generating a maximum detector output level;

a lock-in demodulator receiving said detector output for generating a harmonic signal of said detector output; and a divider circuit receiving said maximum detector output level and said harmonic signal and generating a ratio correlative to the relative strengths thereof.

4. The fiber optics sensor, as set forth in claim 1, further comprising a phase modulator coupled to said polarization maintaining optic fiber for applying at least one modulation waveform to phase modulate said two linearly polarized light waves to include an A.C. component and a D.C. component.

5. The fiber optics sensor, as set forth in claim 4, wherein said phase modulator applies a periodic waveform and a ramp-like function to phase modulate said two linearly polarized light waves.

6. The fiber optics sensor, as set forth in claim 4, wherein said phase modulator applies a periodic square waveform and a periodic saw tooth waveform to phase modulate said two linearly polarized light waves.

7. The fiber optics sensor, as set forth in claim 6, wherein said phase modulator applies said periodic square waveform off-proper frequency.

8. The fiber optics sensor, as set forth in claim 6, wherein said correcting means comprises:

means coupled to said phase modulator for varying a slope of said saw tooths in said modulation waveform to achieve a zero first harmonic signal in said detector output; and a circuit coupled to said phase modulator and receiving said periodic saw tooth waveform for determining a slope of said saw tooth waveform.

9. The fiber optics sensor, as set forth in claim 8, wherein said circuit comprises a counter for counting the number of saw tooths occurring in a predetermined time period.

10. The fiber optics sensor, as set forth in claim 4, wherein said phase modulator is a birefringence modulator.

11. The fiber optics sensor, as set forth in claim 1, wherein said correcting means comprises means for computing:

$$\frac{I_{1H}}{I_{DMAX}}$$

where $I_{1H}$ is a first harmonic signal of said detector output, and $I_{DMAX}$ is a maximum level of said detector output.

12. The fiber optics sensor, as set forth in claim 5, wherein said correcting means comprises means for computing:

$$\gamma \cdot \frac{I_{DMAX}}{I_{DMIN}}$$

where $\gamma$ is a constant related to an average slope of said ramp-like function, $I_{DMAX}$ is a maximum level of said detector output, and $I_{DMIN}$ is a minimum level of said detector output.

13. A method for accurately measuring current flowing in a conductor using an in-line fiber optics sensor, comprising the steps of:

providing a polarization maintaining optic fiber forming an optical path;

generating and sending two linearly polarized light waves traveling in said polarization maintaining optic fiber on said optical path;

converting said two linearly polarized light waves into two circularly polarized light waves traveling on said optical path toward a sensing region;

passing said circularly polarized light waves through said sensing region which experience a differential phase shift caused by said current flowing in the conductor proximate to said sensing region;

returning said phase shifted circularly polarized light waves through said sensing region which experience another differential phase shift;

converting said two phase shifted circularly polarized light waves back into two linearly polarized light waves;

detecting said differential phase shift in said circularly polarized light waves and producing an output correlative to a magnitude of said current, said detector output including an incoherent D.C. light component introduced by an imperfection in said converting step; and means for receiving said detector output and correcting said detected magnitude in response to said incoherent D.C. light component to provide an accurate sensor measurement.

14. The method, as set forth in claim 13, wherein said correcting step comprises the steps of:

receiving said detector output and generating an output representative of the strength of a D.C. signal in said detector output;

receiving said detector output and generating an output level correlative to an A.C. spectrum in said detector output; and comparing the relative strengths of said D.C. output level and said A.C. output level to determine said incoherent D.C. light component.

15. The method, as set forth in claim 13, wherein said correcting step comprises the steps of:

receiving said detector output and generating a maximum detector output level;

receiving said detector output and generating a harmonic signal of said detector output; and receiving said maximum detector output level and said harmonic signal and generating a ratio correlative to the relative strengths thereof.

16. The method, as set forth in claim 13, further comprising the step of applying at least one modulation waveform to phase modulate said two linearly polarized light waves to include an A.C. component and a D.C. component.

17. The method, as set forth in claim 16, wherein said phase modulating step includes the step of applying a periodic waveform and a ramp-like function to phase modulate said two linearly polarized light waves.

18. The method, as set forth in claim 16, wherein said phase modulating step includes the step of applying a periodic square waveform and a periodic saw tooth waveform to phase modulate said two linearly polarized light waves.

19. The method, as set forth in claim 16, wherein said phase modulating step includes the step of applying said periodic square waveform off-proper frequency.

20. The method, as set forth in claim 18, wherein said correcting step comprises the steps of:

varying a slope of said saw tooths in said modulation waveform to achieve a zero first harmonic signal in said detector output; and receiving said periodic saw tooth waveform and determining a slope of said saw tooth waveform.

21. The method, as set forth in claim 20, wherein said slope determining step comprises the step of counting the number of saw tooths occurring in a predetermined time period.

22. The method, as set forth in claim 13, wherein said correcting step comprises the step for computing:

$$\frac{I_{1H}}{I_{DMAX}}$$

where $I_{1H}$ is a first harmonic signal of said detector output, and $I_{DMAX}$ is a maximum level of said detector output.

23. The method, as set forth in claim 17, wherein said correcting step comprises the step for computing:

$$\gamma \cdot \frac{I_{DMAX}}{I_{DMIN}}$$

where $\gamma$ is a constant related to an average slope of said ramp-like function, $I_{DMAX}$ is a maximum level of said detector output, and $I_{DMIN}$ is a minimum level of said detector output.

24. A fiber optics sensor, comprising:

a polarization maintaining optic fiber forming an optical path;

two linearly polarized light waves traveling in said polarization maintaining optic fiber on said optical path;

at least one quarter waveplate coupled to said optic fiber for converting said two linearly polarized light waves into two circularly polarized light waves traveling on said optical path toward a sensing region;

said sensing region including a sensing medium coupled to said polarization maintaining optic fiber at generally a mid-point in said optical path, said circularly polarized light waves passing through said sensing medium experiencing a differential phase shift caused by a magnetic field or current flowing in a conductor proximate to said sensing region;

a detector coupled to said optic fiber detecting said differential phase shift in said circularly polarized light waves producing an output correlative to a magnitude of said magnetic field or said current, said detector output including an incoherent D.C. light component introduced by imperfections in said quarter waveplate; and means for receiving said detector output and varying the wavelength of said two linearly polarized light to minimize said incoherent D.C. light component to provide an accurate sensor measurement.

* * * * *